US012456711B2

(12) United States Patent
Shin et al.

(10) Patent No.: US 12,456,711 B2
(45) Date of Patent: Oct. 28, 2025

(54) SEMICONDUCTOR PACKAGE

(71) Applicant: SAMSUNG ELECTRONICS CO., LTD., Suwon-si (KR)

(72) Inventors: Chihong Shin, Suwon-si (KR); Raehyung Do, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 402 days.

(21) Appl. No.: 18/096,859

(22) Filed: Jan. 13, 2023

(65) Prior Publication Data

US 2023/0411354 A1     Dec. 21, 2023

(30) Foreign Application Priority Data

Jun. 16, 2022   (KR) ........................ 10-2022-0073630

(51) Int. Cl.
    *H01L 25/065*       (2023.01)
    *H01L 23/00*        (2006.01)
                    (Continued)

(52) U.S. Cl.
    CPC ...... *H01L 25/0657* (2013.01); *H01L 23/3121* (2013.01); *H01L 23/49838* (2013.01); *H01L 24/06* (2013.01); *H01L 24/48* (2013.01); *H01L 24/49* (2013.01); *H01L 2224/04042* (2013.01); *H01L 2224/06135* (2013.01); *H01L 2224/48091* (2013.01); *H01L 2224/48145* (2013.01); *H01L 2224/48227* (2013.01); *H01L 2224/48465* (2013.01); *H01L 2224/48471* (2013.01); *H01L 2224/4903* (2013.01); *H01L 2224/49051* (2013.01); *H01L 2224/49096* (2013.01);

(Continued)

(58) Field of Classification Search
None
See application file for complete search history.

(56) References Cited

U.S. PATENT DOCUMENTS 4,618,879 A * 10/1986 Mizukoshi ............ H01L 23/498
                                                       257/784
8,129,263 B2     3/2012   Lee et al.
(Continued)

FOREIGN PATENT DOCUMENTS

| JP | 2007115981 A | * 5/2007 | ............ H01L 24/49 |
| JP | 5332211 A | 11/2013 | |
| KR | 10-2007-0062084 A | 6/2007 | |

*Primary Examiner* — Cory W Eskridge
(74) *Attorney, Agent, or Firm* — Sughrue Mion, PLLC

(57) ABSTRACT

A semiconductor package includes a package substrate having substrate pads disposed in a first direction on one surface, a semiconductor chip having chip pads disposed in the first direction, and bonding wires connecting the chip pads and the substrate pads. The bonding wires include first and second bonding wires alternately connected to the substrate pads respectively, in the first direction, the first bonding wires are connected to the substrate pads at a first angle less than a right angle with respect to a direction of the semiconductor chip, the second bonding wires are connected to the substrate pads at a second angle less than the first angle with respect to the direction of the semiconductor chip and a position at which the first bonding wires contact the substrate pads is closer to the semiconductor chip than a position at which the second bonding wires contact the substrate pads is to the semiconductor chip.

20 Claims, 21 Drawing Sheets

(51) Int. Cl.
*H01L 23/31* (2006.01)
*H01L 23/498* (2006.01)

(52) U.S. Cl.
CPC ............... *H01L 2224/49175* (2013.01); *H01L 2225/06506* (2013.01); *H01L 2225/0651* (2013.01); *H01L 2225/06562* (2013.01)

(56) References Cited

U.S. PATENT DOCUMENTS

| | | |
|---|---|---|
| 9,281,289 B2 | 3/2016 | Imazeki et al. |
| 2003/0218245 A1* | 11/2003 | Matsuzawa ............. H01L 24/05 257/734 |
| 2006/0208349 A1 | 9/2006 | Fukuda et al. |
| 2020/0051956 A1 | 2/2020 | Karhade et al. |
| 2023/0178518 A1* | 6/2023 | Do .......................... H01L 24/48 |

* cited by examiner

SEMICONDUCTOR PACKAGE

CROSS-REFERENCE TO RELATED APPLICATION(S)

This application claims priority to Korean Patent Application No. 10-2022-0073630 filed on Jun. 16, 2022 in the Korean Intellectual Property Office, the entire disclosure of which is incorporated by reference herein in its entirety.

BACKGROUND

The present disclosure relates to a semiconductor package.

With the development of the electronics industry, demand for high-functionality, high-speed, and miniaturization of electronic components is increasing. In line with this trend, a semiconductor packaging method of stacking and mounting semiconductor chip stacks including several semiconductor chips may be used. A packaging method of stacking a plurality of semiconductor stacks may cause the length of the bonding wire to become longer, and may negatively affect the semiconductor stack by causing the loop of the bonding wire to incline to side and come into contact with the neighboring bonding wire.

SUMMARY

One or more example embodiments provide a semiconductor package in which contact between a capillary and an adjacent bonding wire may be prevented in the process of forming a bonding wire.

According to an aspect of an example embodiment, a semiconductor package includes: a package substrate including first substrate pads arranged in a row in a first direction on a surface of the package substrate, and second substrate pads arranged in a row parallel to the row of the first substrate pads in the first direction on the surface of the package substrate; a first semiconductor chip disposed on the surface of the substrate and including first chip pads disposed in the first direction, the first semiconductor chip being closer to the first substrate pads than to the second substrate pads; a second semiconductor chip including second chip pads disposed in the first direction, the second semiconductor chip overlapping an upper portion of the first semiconductor chip; lower bonding wires connecting the first chip pads to the first substrate pads; and upper bonding wires connecting the second chip pads to the second substrate pads, wherein the upper bonding wires include first upper bonding wires and second upper bonding wires alternately arranged in the first direction, wherein the first upper bonding wires contact the second substrate pads at an angle of 45° to 75° with respect to a direction of the first semiconductor chip, wherein a position at which the first upper bonding wires contact the second substrate pads is closer to the first semiconductor chip than a position at which the second upper bonding wires contact the second substrate pads is to the first semiconductor chip, and wherein the first upper bonding wires and the second upper bonding wires have a loop trajectory overlapping 70% or more.

According to an aspect of an example embodiment, a semiconductor package includes: a package substrate including first substrate pads arranged in a row in a first direction on a surface of the package substrate, and second substrate pads arranged in a row parallel to the row of the first substrate pads in the first direction on the surface of the package substrate; a first semiconductor stack disposed on the surface of the package substrate and including at least two first semiconductor chips stacked offset from each other, each of the at least two first semiconductor chips including first chip pads disposed adjacent to a side edge of the respective first semiconductor chip; a second semiconductor stack disposed on the first semiconductor stack and including at least two second semiconductor chips stacked offset from each other, each of the at least two second semiconductor chips including second chip pads disposed adjacent to a side edge of the respective second semiconductor; lower bonding wires connecting the package substrate to a lowermost first semiconductor chip of the first semiconductor stack; and upper bonding wires connecting the package substrate to a lowermost second semiconductor chip of the second semiconductor stack, wherein the upper bonding wires include first upper bonding wires and second upper bonding wires alternately disposed in the first direction, and the first upper bonding wires contact the second substrate pads, and wherein a position at which the first upper bonding wires contact the second substrate pads is closer to the first semiconductor chip than a position at which the second upper bonding wires contact the second substrate pads is to the first semiconductor chip.

According to an aspect of an example embodiment, a semiconductor package includes: a package substrate includes substrate pads disposed in rows parallel to each other in a first direction on a surface of the package substrate; a semiconductor chip including chip pads disposed in the first direction on the surface of the package substrate and spaced apart from the substrate pads; and bonding wires connecting the chip pads and the substrate pads, wherein the bonding wires include first bonding wires and second bonding wires alternately connected to the substrate pads in the first direction, wherein the first bonding wires are connected to the substrate pads at a first angle less than a right angle with respect to a direction of the semiconductor chip, wherein a position at which the first bonding wires contact the substrate pads is closer to the semiconductor chip than a position at which the second bonding wires contact the substrate pads is to the semiconductor chip, and wherein the second bonding wires are connected to the substrate pads at a second angle less than the first angle with respect to the direction of the semiconductor chip.

BRIEF DESCRIPTION OF DRAWINGS

The above and other aspects and features will be more apparent from the following description of example embodiments, taken in conjunction with the accompanying drawings, in which.

DETAILED DESCRIPTION

Hereinafter, example embodiments will be described with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
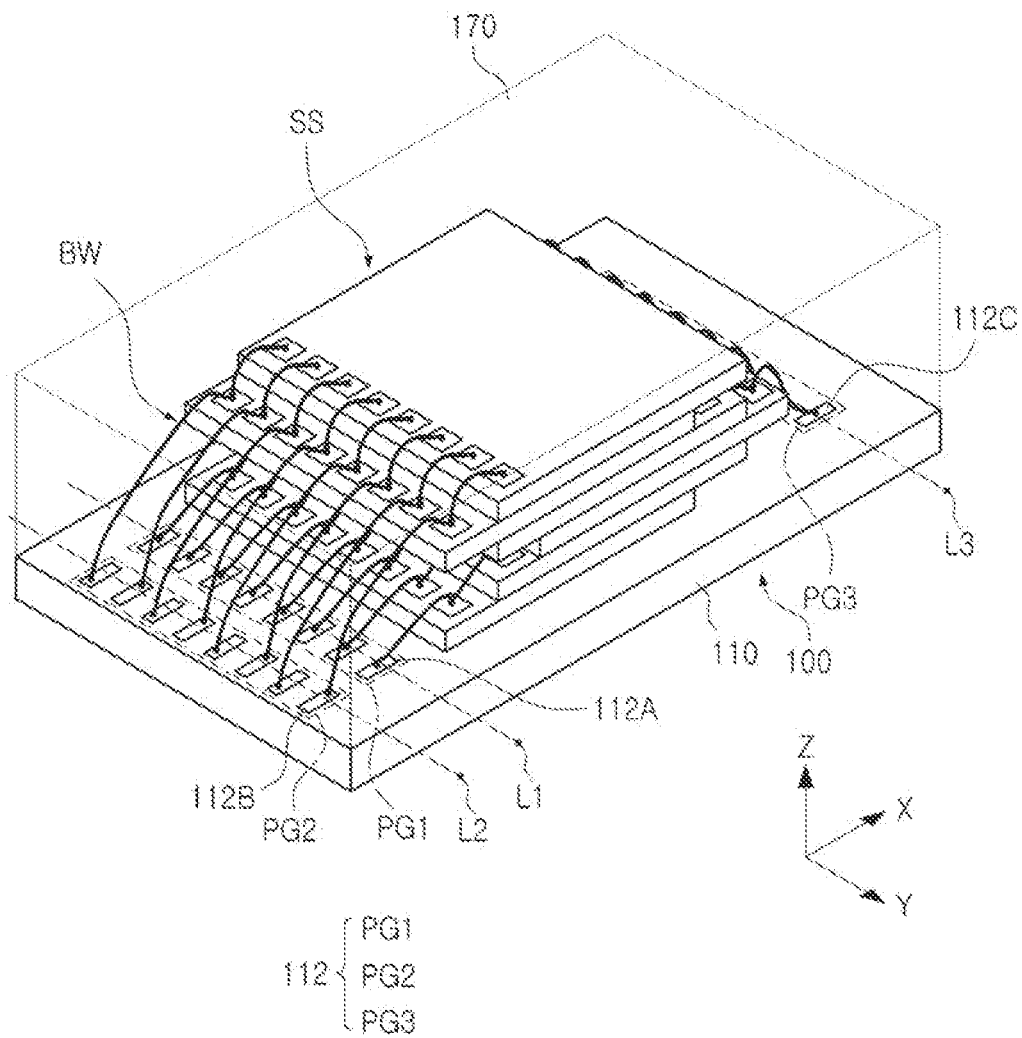
FIG. 1 is a perspective view of a semiconductor package according to an example embodiment.
Figure 2:
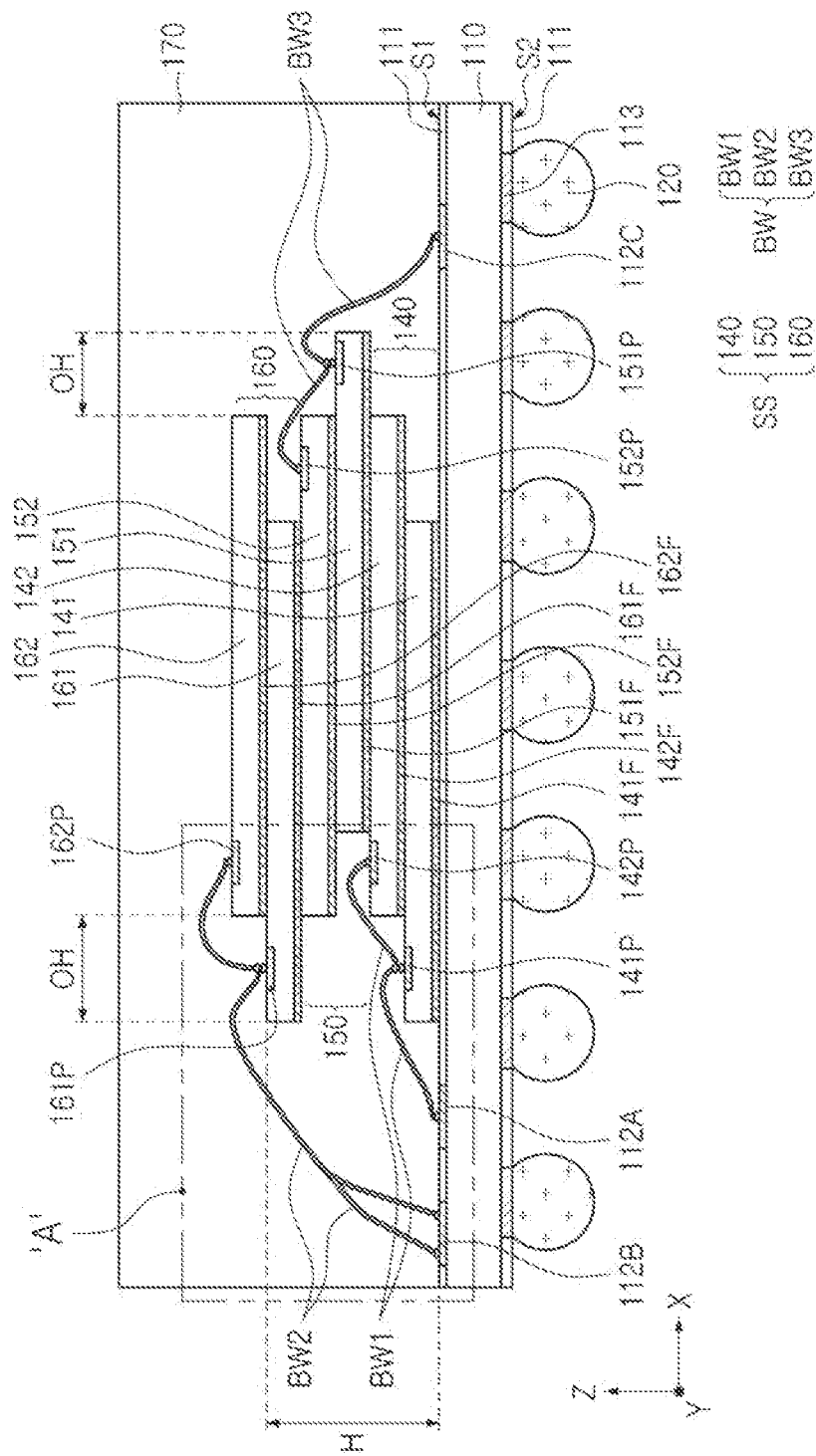
FIG. 2 is a side view of the semiconductor package as viewed in the Y-axis direction of FIG. 1.

Referring to FIGS. 1 and 2, the semiconductor package 100 may include a package substrate 110, a semiconductor stack SS, a bonding wire BW, and an encapsulant 170.

The package substrate 110 may have a plate shape having a first surface S1 and a second surface S2. For example, the package substrate 110 may be a printed circuit board (PCB) or a silicon interposer substrate (Si interposer substrate). A substrate pad 112 may be disposed on the first surface S1 of the package substrate 110, and a bump pad 113 may be disposed on the second surface S2 of the package substrate 110. An internal wiring connecting the substrate pad 112 and the bump pad 113 may be included in the package substrate 110. The substrate pad 112 and the bump pad 113 may be patterned in the solder resist layer 111.

The substrate pad 112 may include a plurality of substrate pads 112 divided into groups and disposed on the first surface S1 of the package substrate 110. An example embodiment illustrates, as an example, a case in which the substrate pad 112 is divided into first to third substrate pad groups PG1, PG2, and PG3, and the first to third substrate pad groups PG1, PG2, and PG3 include first to third substrate pads 112A, 112B and 112C, respectively, but the number of substrate pad groups and the number of substrate pads in each group may be variously modified. The first to third substrate pad groups PG1, PG2, and PG3 may be respectively arranged in the first direction (Y-direction) and may be disposed along imaginary first to third straight lines L1, L2, and L3 that are parallel to each other. For example, the first substrate pad group PG1 and the second substrate pad group PG2 may be disposed on one side of the semiconductor stack SS and parallel to the semiconductor stack SS, the third substrate pad group PG3 may be disposed on the other side of the semiconductor stack SS and parallel to the semiconductor stack SS. In addition, the first substrate pad group PG1 may be disposed closer to the semiconductor stack SS than the second substrate pad group PG2 and the third substrate pad group PG3, and the third substrate pad group PG3 may be disposed closer to the semiconductor stack SS than the second substrate pad group PG2. The substrate pad 112 may be a bonding finger elongated in the X-direction. For example, the substrate pad 112 may be formed on the first surface S1 of the package substrate 110 to a length of about 300 to 400 µm, and may be disposed at a pitch of about 65 µm or less. The first to third substrate pads 112A, 112B, and 112C may have the same pitch. However, embodiments of the present disclosure are not limited thereto, and according to example embodiments, the first to third substrate pads 112A, 112B, and 112C included in the first to third substrate pad groups PG1, PG2, and PG3 may be inclined to face the semiconductor stack SS, and the pitches of the first to third substrate pads 112A, 112B, and 112C included in the first to third substrate pad groups PG1, PG2, and PG3 may be different. For example, the pitch of the first substrate pads 112A may be smaller than the pitch of the second substrate pads 112B.

The bump pad 113 may be disposed on the second surface S2 of the package substrate 110, and a conductive bump 120 may be attached to the bump pad 113. For example, the conductive bump 120 may have a land, ball, or pin shape. For example, the conductive bump 120 may include tin (Sn) or an alloy (e.g., Sn—Ag—Cu) containing tin (Sn). The conductive bump 120 may be used to electrically connect to an external device such as the package substrate 110, a module substrate, or a system board.

The semiconductor stack SS may be disposed on the first surface S1 of the package substrate 110. For example, the semiconductor stack SS may have a structure in which the first to third chip stack bodies 140, 160, and 150 are stacked. In an example embodiment, the third chip stack 150 is disposed between the first chip stack 140 and the second chip stack 160, and a case in which two semiconductor chips are arranged in each stack will be described as an example. However, the number of chip stacks included in the semiconductor stack SS and the number of semiconductor chips included in each chip stack may be variously modified. For example, the semiconductor stack SS may include seven or more chip stacks.

The first to third chip stacks 140, 160, and 150 may include first semiconductor chips 141 and 142, second semiconductor chips 161 and 162, and third semiconductor chips 151 and 152, respectively. The number of semiconductor chips included in each of the first to third chip stacks 140, 160, and 150 may be the same. However, embodiments of the present disclosure are not limited thereto, and the number of the first semiconductor chips 141 and 142, the number of the second semiconductor chips 161 and 162, and the number of the third semiconductor chips 151 and 152 may be different from each other. The upper surface of the second semiconductor chip 161 disposed at the lowermost portion of the second chip stack 160 may be spaced apart from the first surface S1 of the package substrate 110 by a predetermined distance or more. For example, the predetermined distance may be about 700 µm.

Also, the first semiconductor chips 141 and 142, the second semiconductor chips 161 and 162, and the third semiconductor chips 151 and 152 may be the same type of semiconductor chip having the same size. For example, the first semiconductor chips 141 and 142, the second semiconductor chips 161 and 162, and the third semiconductor chips 151 and 152 may be memory chips of the same type, and may be memory chips having the same capacity. Memory chips include phase change random access memory (PRAM), resistive random access memory (PRAM), magnetic random access memory (MRAM), and dynamic random access memory (DRAM) or a flash memory device. However, the present example embodiment is not limited thereto, and some of the first semiconductor chips 141 and 142, the second semiconductor chips 161 and 162, and the third semiconductor chips 151 and 152 may be heterogeneous semiconductor chips. Also, the sizes of the first semiconductor chips 141 and 142, the sizes of the second semiconductor chips 161 and 162, and the sizes of the third semiconductor chips 151 and 152 may be different from each other.

The first to third chip stacks 140, 160, and 150 include first semiconductor chips 141 and 142, second semiconductor chips 161 and 162, and third semiconductor chips 151 and 152, and may respectively form a cascade structure stacked in a step form. Each of the second and third chip stacks 160 and 150 may have an overhang region in which the lowermost semiconductor chips 161 and 151 further protrude outward than the side surfaces of the uppermost semiconductor chips 142 and 152 disposed therebelow. For example, the overhang region OH of the chip stack body disposed on the upper portion is not supported by the chip chuck layer body disposed on the lower side, and may be defined as an area protruding in the X-axis direction.

The first semiconductor chips 141 and 142, the second semiconductor chips 161 and 162, and the third semiconductor chips 151 and 152 are adhered to each other by adhesive members 141F, 142F, 151F, 152F, 161F, and 162F, respectively, and may be fixed. The adhesive members 141F, 142F, 151F, 152F, 161F, and 162F may be a die attach film.

In the case of the first semiconductor chips 141 and 142, the second semiconductor chips 161 and 162, and the third semiconductor chips 151 and 152, chip pads to which bonding wires are respectively connected may be disposed adjacent to edge regions of any one of the edges disposed in the Y-axis direction. The chip pads 141P, 142P, 151P, 152P, 161P, and 162P may be aligned in rows in the Y-axis direction, and may be spaced apart from each other at regular intervals. For example, the chip pads 141P, 142P, 151P, 152P, 161P, and 162P may be disposed at a pitch of about 60 µm or less.

The bonding wire BW may electrically connect the package substrate 110 and the semiconductor stack SS to each other. Specifically, the bonding wire BW may connect the substrate pad 112 of the package substrate 110 to the chip pad of the semiconductor chip included in the semiconductor stack SS. Also, the bonding wire BW may electrically connect the semiconductor chips included in the semiconductor stack SS to each other. The diameter of the bonding wires BW may be, for example, about 0.7 mil. According to an example embodiment, a first bonding wire BW1 connecting the package substrate 110 and the first chip stack 140 and a second bonding wire BW2 connecting the package substrate 110 and the second chip stack 160 are provided. The bonding wires BW2 are described below. The third bonding wire BW3 connected to the third chip stack 150 has a configuration similar to that of the second bonding wire BW2.

The bonding wire BW may be defined as a lower bonding wire and an upper bonding wire, respectively, depending on the position of the chip stack to be bonded. For example, the first bonding wire BW1 connected to the first chip stack 140 disposed at a relatively lower position is may be described as a lower bonding wire BW1. Also, for example, the second bonding wire BW2 connected to the second chip stack 160 disposed at a relatively higher position may be described as an upper bonding wire BW2.

The lower bonding wire BW1 may include a chip-to-substrate lower bonding wire BW1_A and an inter-chip lower bonding wire BW1_B. The chip-substrate lower bonding wire BW1_A may electrically connect the lowermost first semiconductor chip 141 included in the first chip stack 140 to the package substrate 110. The inter-chip lower bonding wire BW1_B may electrically connect the first semiconductor chips 141 and 142 included in the first chip stack 140 to each other.

The chip-substrate lower bonding wire BW1_A may electrically connect the package substrate 110 and the lowermost first semiconductor chip 141 of the first chip stack 140. The first chip pad 141P may be electrically connected to the first substrate pad 112A through lower bonding wire BW1_A. An electrical signal may be transmitted between the package substrate 110 and the lowermost semiconductor chip 141 through the chip-substrate lower bonding wire BW1_A.

The inter-chip lower bonding wire BW1_B may connect the first semiconductor chips 141 and 142 to each other. An electrical signal may be transmitted between the first semiconductor chips 141 and 142 through the inter-chip lower bonding wire BW1_B. Accordingly, the electrical signal transmitted from the package substrate 110 through the chip-substrate lower bonding wire BW1_A may be transmitted to the uppermost first semiconductor chip 142 through the inter-chip lower bonding wire BW1_B.

The chip-to-substrate lower bonding wire BW1_A and the inter-chip lower bonding wire BW1_B may be bonded by a forward bonding method. For example, after bonding one end of the chip-substrate lower bonding wire BW1_A to the first chip pad 141P of the lowermost first semiconductor chip 141 by ball bonding, the other end of the chip-substrate lower bonding wire BW1_A may be connected to the first substrate pad 112A of the package substrate 110 by stitch bonding. According to an example embodiment, the chip-substrate lower bonding wire BW1_A may be stitch-bonded to the stud bump BP formed on the first substrate pad 112A.

In addition, after bonding one end of the lower inter-chip bonding wire BW1_B to the first chip pad 142P of the uppermost first semiconductor chip 142 by ball bonding, the other end of the lower inter-chip bonding wire BW1_B may be connected to the first chip pad 141P of the lowermost first semiconductor chip 141 by stitch bonding. According to an example embodiment, the inter-chip lower bonding wire BW1_B may be stitch-bonded to the stud bump BP formed on the first chip pad 142P.

The upper bonding wire BW2 may include a chip-to-substrate upper bonding wire BW2_A and an inter-chip upper bonding wire BW2_B. The chip-substrate upper bonding wire BW2_A may electrically connect the lowermost semiconductor chip 161 included in the second chip stack 160 to the package substrate 110. The inter-chip upper bonding wire BW2_B may electrically connect the semiconductor chips 161 and 162 included in the second chip stack 160 to each other.

The inter-chip upper bonding wire BW2_B may connect the second semiconductor chips 161 and 162 to each other. An electrical signal may be transmitted between the second semiconductor chips 161 and 162 through the inter-chip lower bonding wire BW2_B. Accordingly, the electrical signal transmitted from the package substrate 110 through the chip-to-substrate upper bonding wire BW2_A may be transmitted to the second semiconductor chips 161 and 162 through the inter-chip upper bonding wire BW2_B.

The chip-substrate upper bonding wire BW2_A may electrically connect the package substrate 110 and the lowermost second semiconductor chip 161 of the second chip stack 160. For example, the chip-substrate upper bonding wire BW2_A includes the second substrate pad 112B of the package substrate 110 and the chip pad 161P may be electrically connected to each other. An electrical signal may be transmitted between the package substrate 110 and the lowermost second semiconductor chip 161 through the chip-substrate upper bonding wire BW2_A.

The chip-substrate upper bonding wire BW2_A may be bonded by a reverse bonding method. For example, after bonding one end of the chip-board upper bonding wire BW2_A to the second substrate pad 112B of the package substrate 110 by ball bonding, the other end of the chip-substrate upper bonding wire BW2_A may be connected to the chip pad 161P of the lowermost second semiconductor chip 161 by stitch bonding. According to an example embodiment, the chip-substrate upper bonding wire BW2_A may be stitch-bonded to the stud bump BP formed on the chip pad 161P of the lowermost second semiconductor chip 161.

Also, the inter-chip upper bonding wire BW2_B may be bonded by a reverse bonding method. For example, after bonding one end of the inter-chip upper bonding wire BW2_B to the second chip pad 161P of the lowermost second semiconductor chip 161 by ball bonding, the other end of the inter-chip upper bonding wire BW2_B may be connected to the second chip pad 162P of the second uppermost semiconductor chip 162 by stitch bonding. According to an example embodiment, the inter-chip upper bonding wire BW2_B may be stitch-bonded to the stud bump BP formed on the second chip pad 162P of the uppermost second semiconductor chip 162.

In the semiconductor package 100 according to an example embodiment, the upper bonding wire BW2 may, for example, be bonded by a reverse bonding method, and the lower bonding wire BW1 may, for example, be bonded by a forward bonding method.

The forward bonding method may have high productivity compared to the reverse bonding method because it connects the objects to be connected with the shortest distance. However, when bonding objects with a large height difference using the forward bonding method, in the process of extending in the direction of the substrate pad after bonding at the chip pad, the loop of the bonding wire may be inclined to the side, and a short circuit may occur through contact with other bonding wires that have already been bonded. Since the chip-substrate upper bonding wire BW2_A of an example embodiment bonds between the second substrate pad 112B of the package substrate 110 and the lowermost second semiconductor chip 161 having a large height difference, when using the forward bonding method, a sagging phenomenon in which the loop of the chip-board upper bonding wire BW2_A is inclined laterally may occur. In an example embodiment, by bonding the chip-board upper bonding wire (BW2_A) by a reverse bonding method, it is possible to prevent the problem that the loop of the chip-board upper bonding wire BW2_A is inclined to the side.

The chip-substrate upper bonding wire BW2_A is connected to the second substrate pad 112B depending on the position, and may be classified into a first group of first chip-board upper bonding wires BW2_A1 and a second group other than the first group of second chip-board upper bonding wires BW2_A2.

Figure 5:
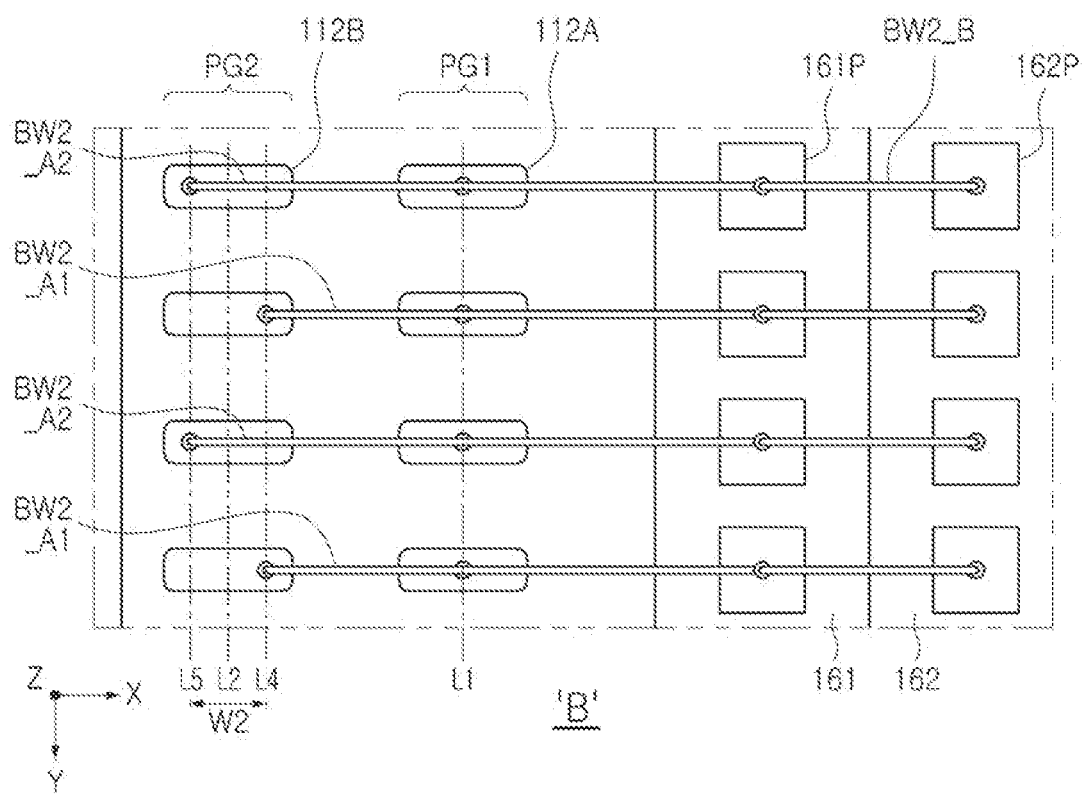
FIG. 5 is an enlarged view of part B of FIG. 4.

Referring to FIG. 5, the first chip-to-substrate upper bonding wire BW2_A1 and the second chip-to-substrate upper bonding wire BW2_A2 may be alternately disposed in the Y-direction, and may be alternately connected to the second substrate pad 112B. For example, an end of the first chip-to-substrate upper bonding wire BW2_A1 and an end of the second chip-to-substrate upper bonding wire BW2_A2 may be arranged in a zigzag arrangement on the second substrate pad 112B. The length of the first chip-to-substrate upper bonding wire BW2_A1 may be shorter than the length of the second chip-to-substrate upper bonding wire BW2_A2.

One end of the first chip-to-substrate upper bonding wire BW2_A1 and one end of the second chip-to-substrate upper bonding wire BW2_A2 may be connected to the second substrate pad group PG2 of the substrate pad 112 may be respectively connected by ball bonding along an imaginary fourth straight line L4 and a fifth straight line L5 parallel to the second straight line L2 on which the second substrate pad group PG2 is disposed. For example, one end of the first chip-board upper bonding wire BW2_A1 may be disposed on the fourth straight line L4, and one end of the second chip-board upper bonding wire BW2_A2 may be disposed on the fifth straight line L5. For example, the fourth straight line L4 and the fifth straight line L5 may be spaced apart from each other by an interval W2 of about 100 μm or more.

As described above, when the chip-board upper bonding wire BW2_A is bonded by the reverse bonding method, it is possible to solve the problem that the loop of the chip-board upper bonding wire BW2_A is inclined to the side. However, when the pitch of the second substrate pad 112B is very small, in the process of forming the ball bonding on the second substrate pad 112B, a capillary from which the bonding wire is ejected may come into contact with the adjacent bonding wire, such that a loop of the adjacent bonding wire may be deformed. In an example embodiment, one end of the first chip-to-substrate upper bonding wire BW2_A1 and one end of the second chip-to-substrate upper bonding wire BW2_A2 are alternately arranged on the second substrate pad 112B, and the first chip-to-substrate upper bonding wire BW2_A1 having a relatively short length is first bonded, and by later bonding the relatively long second chip-to-substrate upper bonding wire BW2_A1, it is possible to secure a bonding space without the capillary being in contact with the adjacent bonding wire. Accordingly, the problem of the capillary in contact with the adjacent bonding wire in the process of forming the bonding wire may be alleviated.

Figure 3:
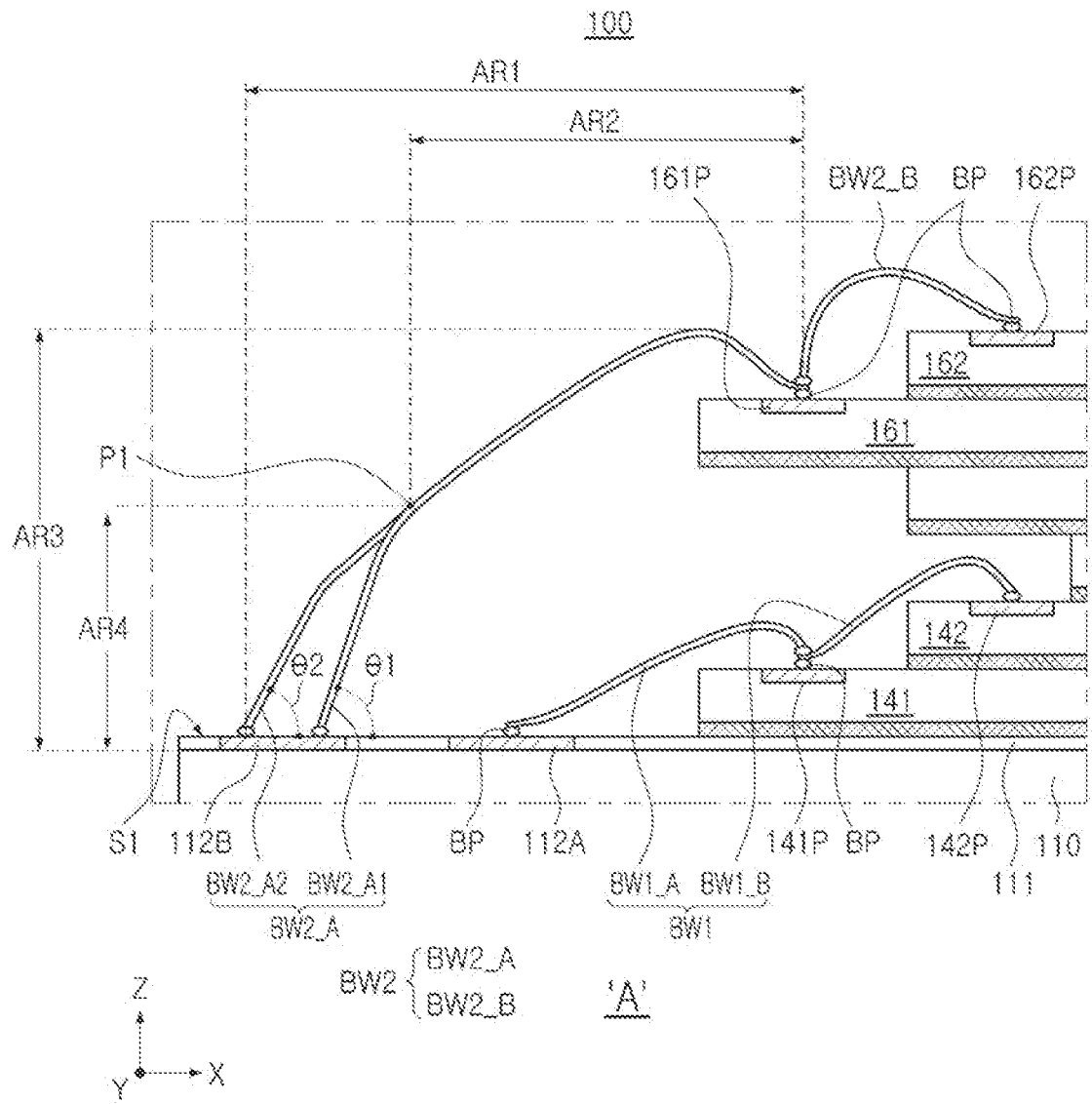
FIG. 3 is an enlarged view of part A of FIG. 2.
Figure 4:
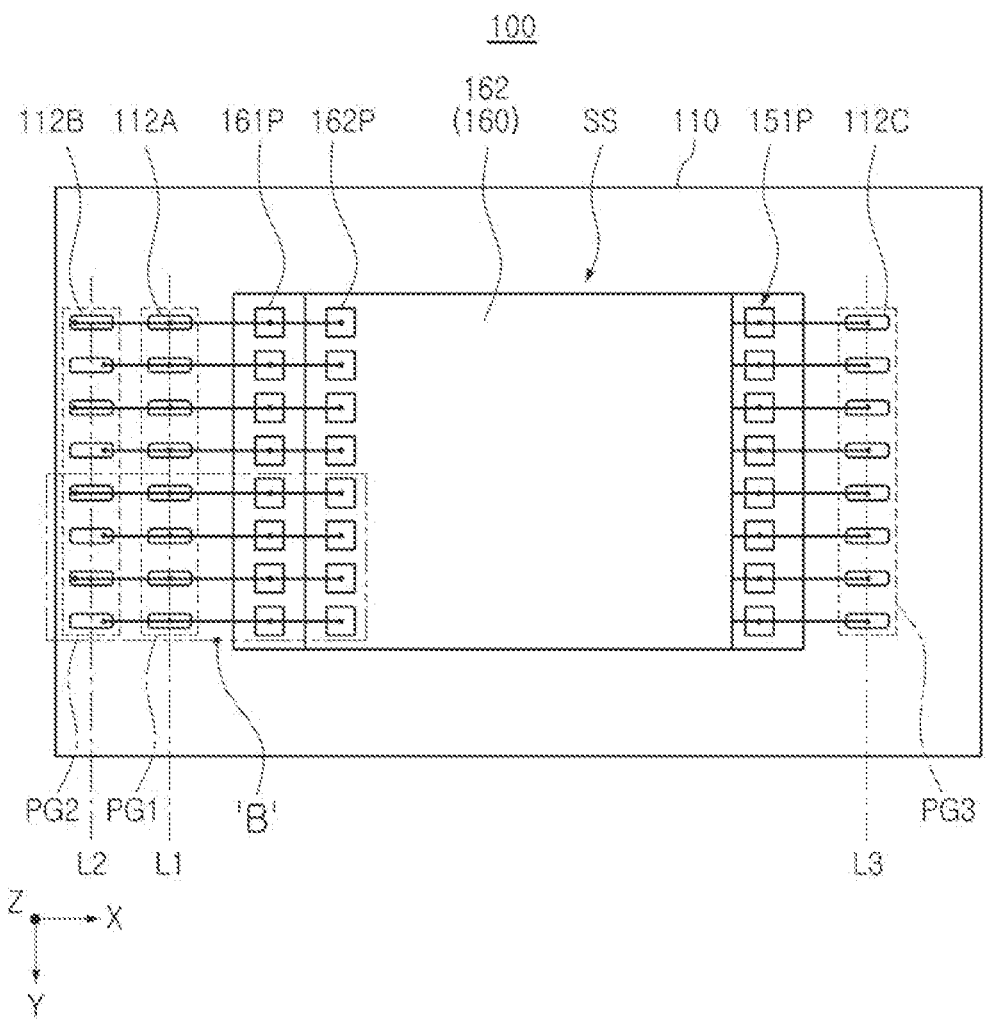
FIG. 4 is a plan view of the semiconductor package as viewed in the Z-axis direction of FIG. 1.

Referring to FIG. 3, a loop of the first chip-to-substrate upper bonding wire BW2_A1 and a loop of the second chip-to-substrate upper bonding wire BW2_A2 may be connected to the first surface S1 of the package substrate 110 to be inclined in the direction of the first chip stack 140. The first chip-substrate upper bonding wire BW2_A1 may be connected to be inclined at a first angle θ1 with respect to the first surface S1 of the package substrate 110. As described above, the first chip-to-substrate upper bonding wire BW2_A1 having a relatively short length is first bonded, and the relatively long second chip-to-substrate upper bonding wire BW2_A2 is bonded later, and since the gap between the first chip-to-substrate upper bonding wire BW2_A1 and the second chip-to-substrate upper bonding wire BW2_A1 is narrow, there may be a problem in that a capillary for forming the second chip-to-substrate upper bonding wire BW2_A2 contacts the first chip-to-substrate upper bonding wire BW2_A1. In an example embodiment, since the first chip-board upper bonding wire BW2_A1 is formed to be inclined with respect to the first surface S1 of the package substrate 110, a problem in which the capillary contacts the adjacent first chip-to-substrate upper bonding wire BW2_A1 may be alleviated.

In addition, according to an example embodiment, the second chip-substrate upper bonding wire BW2_A2 may also be disposed to be inclined at a second angle θ2 with respect to the first surface S1 of the package substrate 110. The first angle θ1 may be greater than the second angle θ2, but is not limited thereto.

A loop trajectory of the first chip-substrate upper bonding wire BW2_A1 and the second chip-substrate upper bonding wire BW2_A2 may be disposed to overlap each other with the first point P1 as a starting point. In detail, the first chip-to-substrate upper bonding wire BW2_A1 and the second chip-to-substrate upper bonding wire BW2_A2 may include a section in which the loop trajectories do not overlap and a section in which the loop trajectories overlap. When the height section AR3 of the loop trajectory of the second chip-board upper bonding wire BW2_A2 is about 1000 μm, the height section AR4 of the first point P1 may be about 750 μm. The section in which the loop trajectories overlap may be defined as an area in which the loop of the first chip-to-substrate upper bonding wire BW2_A1 and the loop of the second chip-to-substrate upper bonding wire BW2_A2 are disposed parallel to each other on a coplanar surface. Among the entire section AR1 of the second chip-to-substrate upper bonding wire BW2_A2, the section AR2 having a loop trajectory overlapped with the first chip-to-substrate upper bonding wire BW2_A1 is 70 of the entire section AR1 % or more. In detail, in the first chip-to-substrate upper bonding wire BW2_A1 and the second chip-to-substrate upper bonding wire BW2_A2, a section in which the loop trajectories do not overlap may be less than 30% of the entire section AR1. The loop of the first chip-to-substrate upper bonding wire BW2_A1 and the loop of the second chip-to-substrate upper bonding wire BW2_A2 become parallel to each other as the second section AR2 increases. Electrical characteristics of electrical signals transmitted through the first chip-to-substrate upper bonding wire BW2_A1 and the second chip-to-substrate upper bonding wire BW2_A2 may be improved.

The encapsulant 170 is disposed on the package substrate 110 and may cover the semiconductor stack SS. Examples of the encapsulant 170 may include an insulating material, for example, a thermosetting resin such as an epoxy resin, a thermoplastic resin such as polyimide, or prepreg containing inorganic filler and/or glass fiber, Ajinomoto Build-up Film (ABF), FR-4, Bismaleimide Triazine (BT), EMC, and the like.

Figure 6A:
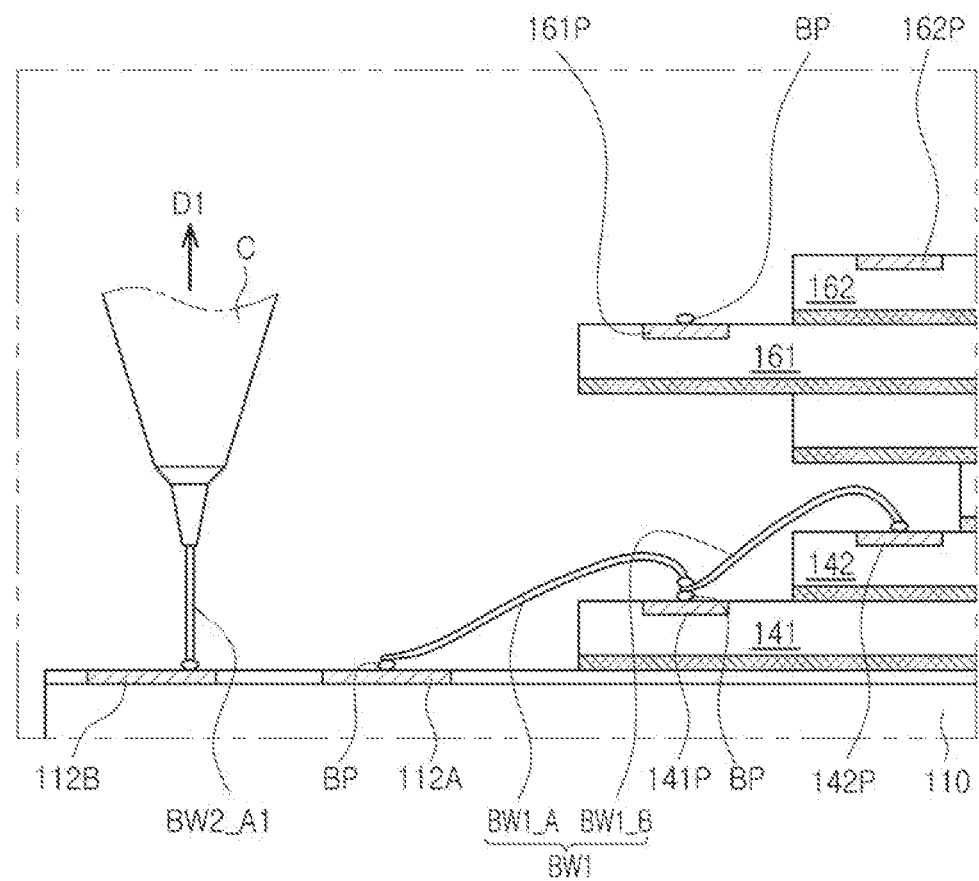
FIGS. 6A to 13B are diagrams illustrating respective processes of a method of manufacturing a semiconductor package according to an example embodiment.
Figure 6B:
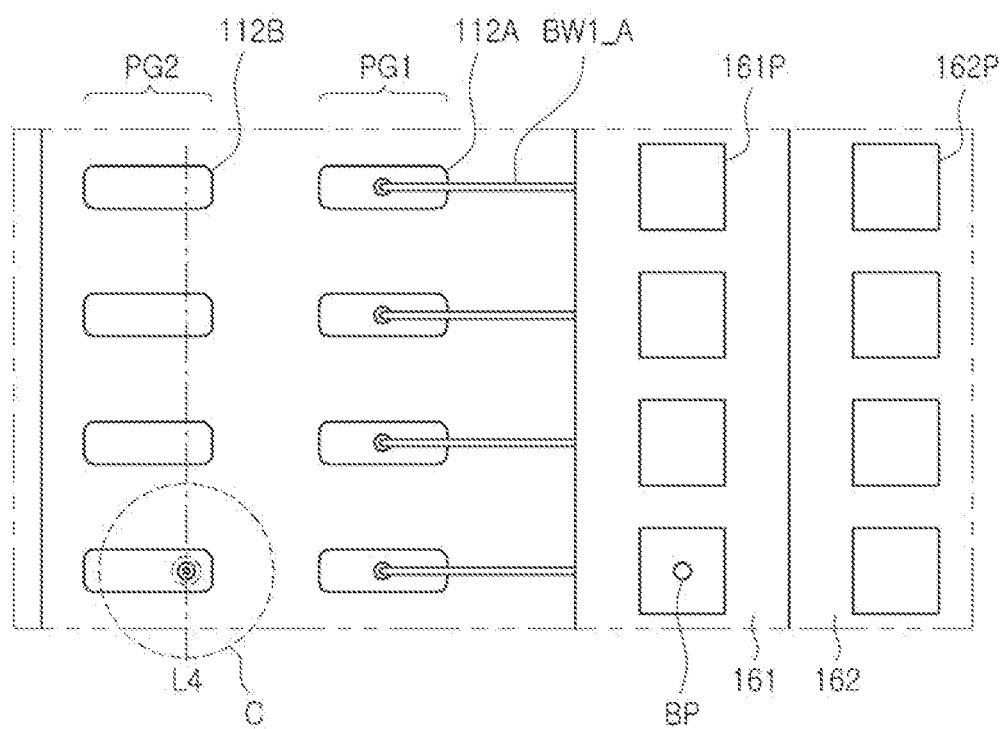

A method of manufacturing the semiconductor package of FIG. 2 will be described with reference to FIGS. 6A to 13B. 6A to 13B are diagrams illustrating processes of a method of manufacturing a semiconductor package according to an example embodiment. FIGS. 6A to 13B may use the same reference numerals as those used to describe the semiconductor package of FIG. 2 to describe the same or similar parts. FIGS. 6A to 13B illustrate a process of bonding a first chip-to-substrate upper bonding wire (BW2_A1), a second chip-to-substrate upper bonding wire (BW2_A2), and an inter-chip upper bonding wire (BW2_B) of the semiconductor package 100 of FIG. 2 by a reverse bonding method. FIGS. 6A and 6B may be understood that after the process of bonding the chip-substrate lower bonding wire BW1_A to the lowermost first semiconductor chip 141 and the process of bonding the inter-chip lower bonding wire BW1_B to the uppermost first semiconductor chip 142 are performed. As described above, the chip-to-substrate lower bonding wire BW1_A and the inter-chip lower bonding wire BW1_B may be bonded by a forward bonding method, and a detailed description thereof will be omitted.

Referring to FIGS. 6A and 6B, the first chip-bonding end of the upper bonding wire BW2_A1 is ball-bonded to the second substrate pad 112B of the package substrate 110, and by moving the capillary (C) in the upward direction (D1), the first chip-board upper bonding wire BW2_A1 may be pulled in the upper direction D1. According to the example embodiment, before forming the first chip-to-substrate upper bonding wire BW2_A1, a stud bump BP may be formed on the chip pad 161P. One end of the first chip-substrate upper bonding wire BW2_A1 may be bonded on the second substrate pad 112B at a point that intersects the fourth virtual straight line L4.

Figure 7A:
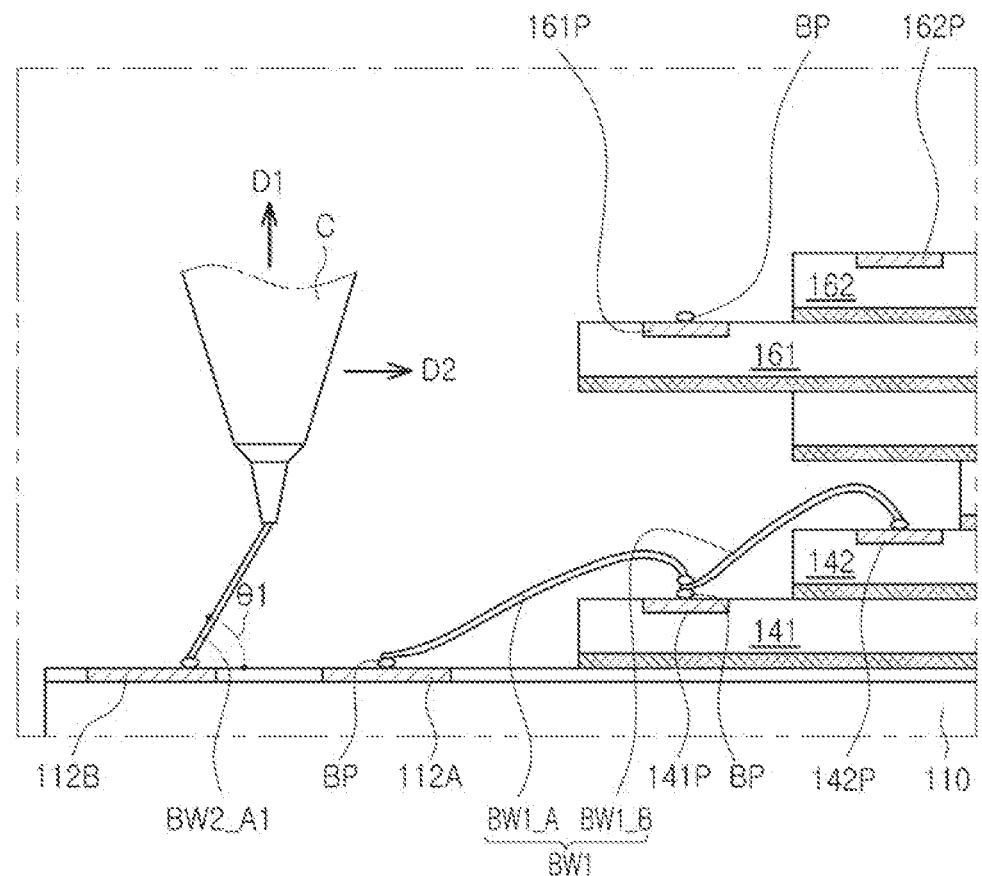
Figure 7B:
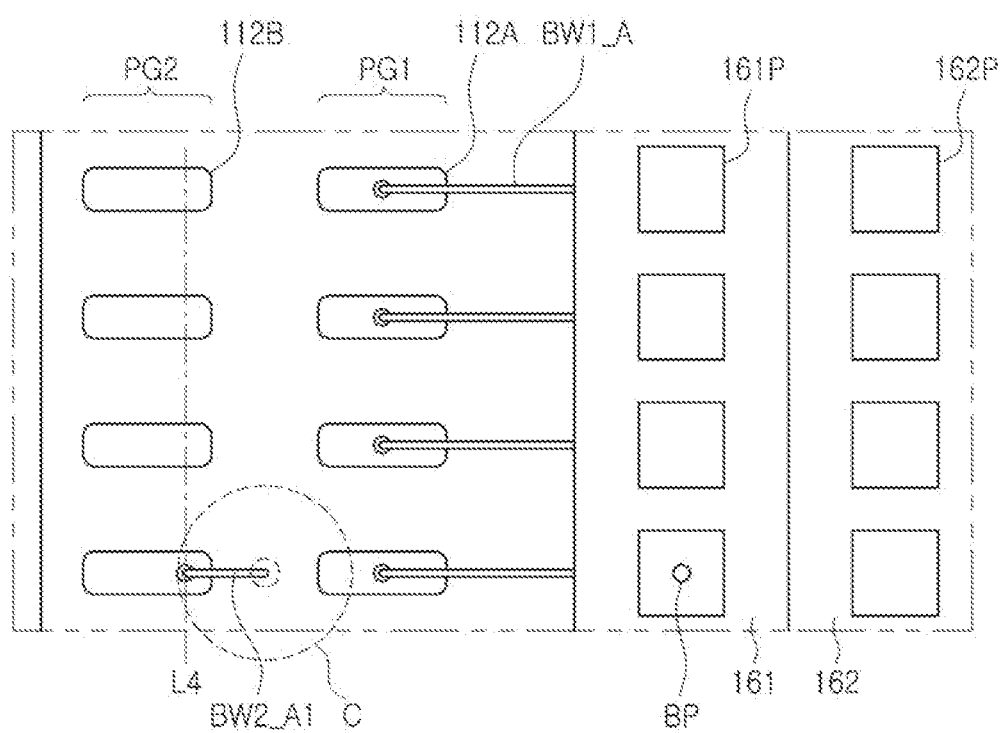

Next, referring to FIGS. 7A and 7B, while moving the capillary C in the upper direction D1, and at the same time moving the first semiconductor chips 141 and 142 in the arrangement direction D2, the first chip-substrate upper bonding wire BW2_A1 may be refracted at a first angle θ1 with respect to the upper surface of the package substrate 110. Therefore, in the example embodiment, a problem in which the capillary contacts the adjacent first chip-to-substrate upper bonding wire BW2_A1 in a subsequent process of forming the second chip-to-substrate upper bonding wire BW2_A2 may be alleviated.

Figure 8A:
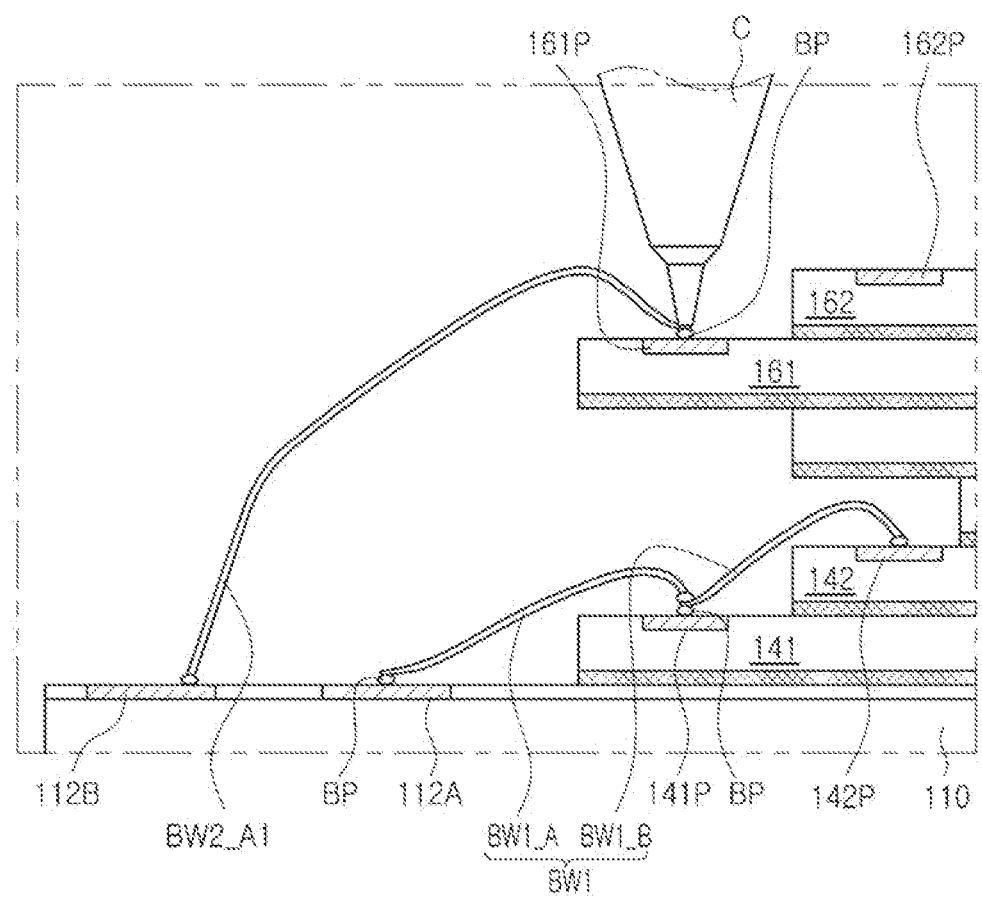
Figure 8B:
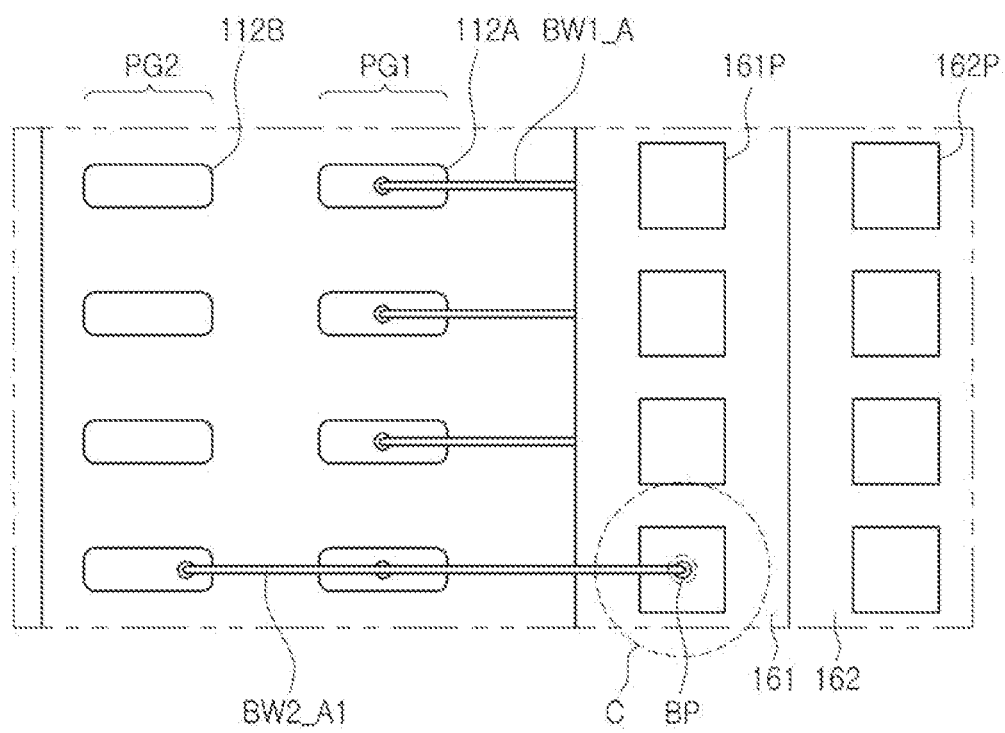

Next, referring to FIGS. 8A and 8B, the other end of the first chip-to-substrate upper bonding wire BW2_A1 may be stitch-bonded on the chip pad 161P of the lowermost second semiconductor chip 161. According to an example embodiment, the other end of the first chip-board upper bonding wire BW2_A1 may be stitch-bonded to the stud bump BP formed on the chip pad 161P.

Figure 9A:
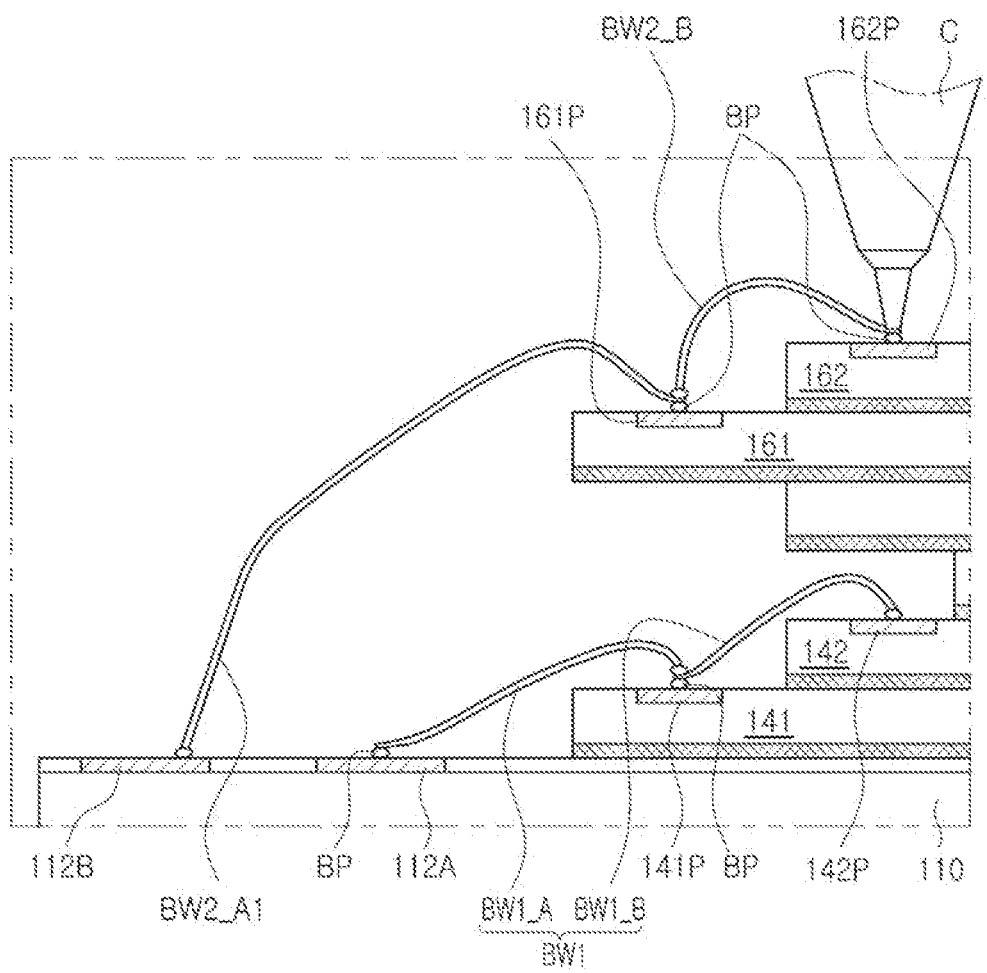
Figure 9B:
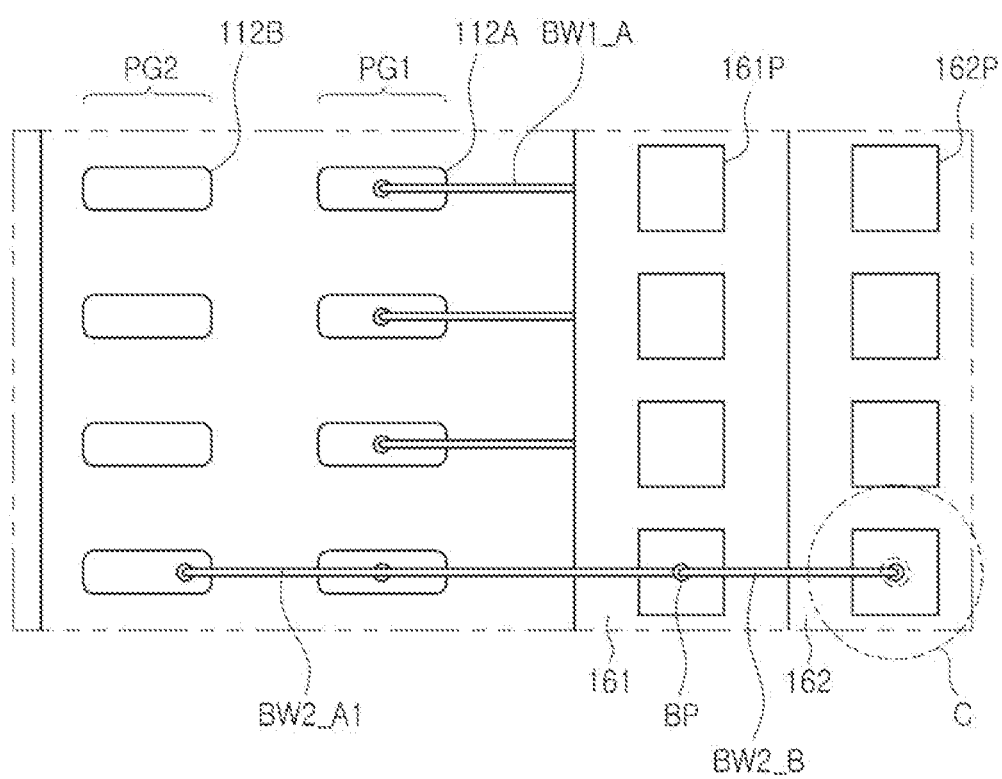

Next, referring to FIGS. 9A and 9B, one end of the inter-chip upper bonding wire BW2_B is bonded to the second chip pad 161P of the lowermost second semiconductor chip 161 by ball bonding, and the other end of the inter-chip upper bonding wire BW2_B may be connected to the second chip pad 162P of the second uppermost semiconductor chip 162 by stitch bonding. According to an example embodiment, one end of the inter-chip upper bonding wire BW2_B may be ball-bonded to the stud bump BP formed on the chip pad 161P. Also, according to an example embodiment, the other end of the inter-chip upper bonding wire BW2_B may be stitch-bonded to the stud bump BP formed on the second chip pad 162P of the uppermost second semiconductor chip 162. Thereafter, the process of bonding the first chip-to-substrate upper bonding wire BW2_A1 and the inter-chip upper bonding wire BW2_B (processes of FIGS. 6A to 9A) may be repeatedly performed. Therefore, after the bonding process of the first chip-board upper bonding wire BW2_A1 is completed, a subsequent process of bonding the second chip-board upper bonding wire BW2_A2 may be performed.

Figure 10A:
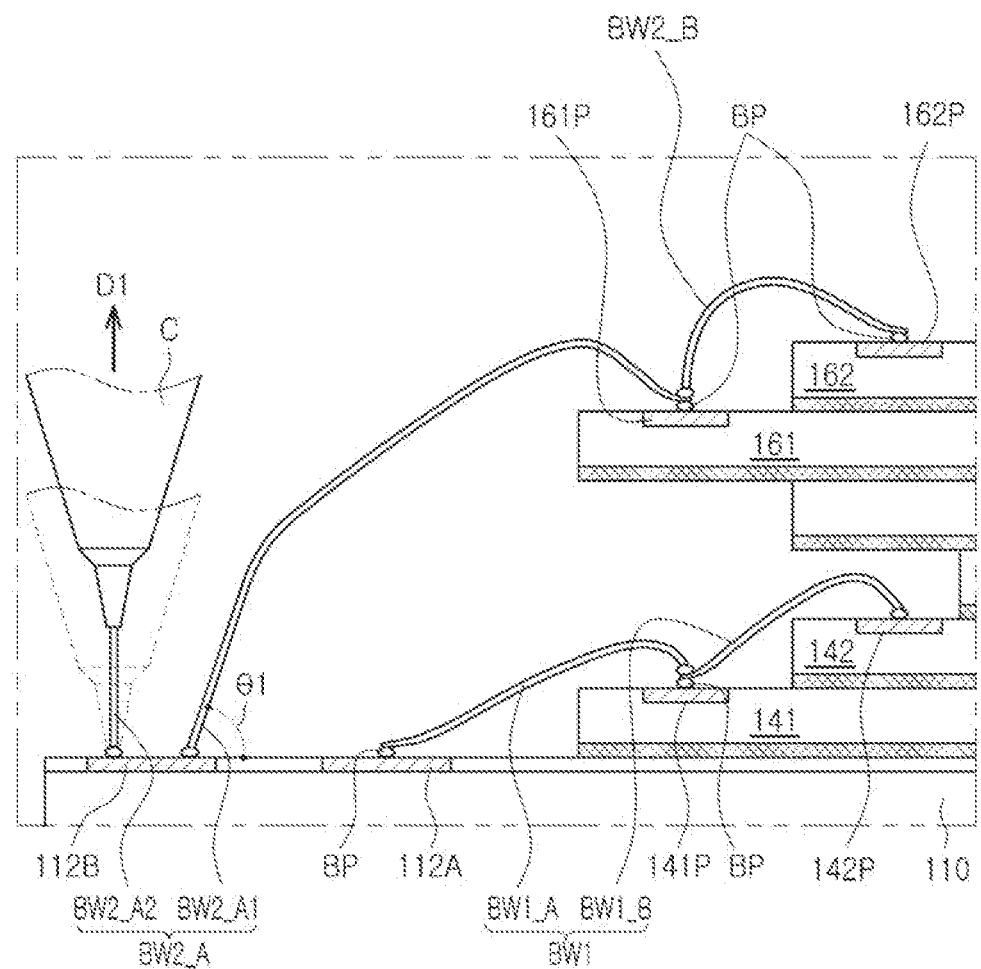
Figure 10B:
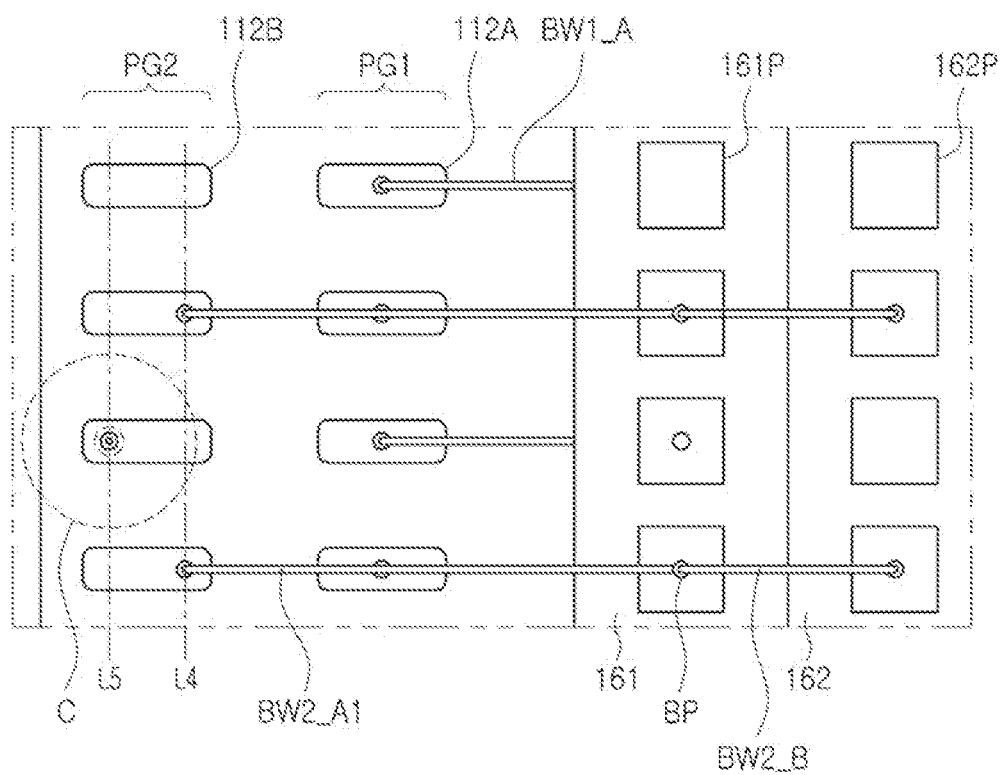

Next, referring to FIGS. 10A and 10B, the second chip-bonding end of the upper bonding wire BW2_A2 is ball-bonded to the second substrate pad 112B of the package substrate 110, and by moving the capillary C in the upper direction D1, the second chip-board upper bonding wire BW2_A2 may be pulled in the upper direction D1. In the previous process, in the process of bending the first chip-board upper bonding wire BW2_A1 at a first angle θ1 with the upper surface of the package substrate 110, it can be seen that the space of the capillary C is secured and the first chip-substrate upper bonding wire BW2_A1 is not in contact. According to the example embodiment, before forming the second chip-to-substrate upper bonding wire BW2_A2, a stud bump BP may be formed on the chip pad 161P. One end of the second chip-to-substrate upper bonding wire BW2_A2 may be bonded on the second substrate pad 112B at a point crossing the fifth straight line L5 parallel to the fourth straight line L4. Accordingly, one end of the second chip-to-substrate upper bonding wire BW2_A2 may be arranged in a zigzag arrangement with one end of the first chip-to-substrate upper bonding wire BW2_A1 and the second substrate pad 112B. As such, by alternately arranging one end of the first chip-to-substrate upper bonding wire BW2_A1 and one end of the second chip-to-substrate upper bonding wire BW2_A2 to the second substrate pad 112B, it is possible to secure a bonding space without the capillary C in contact with the adjacent first chip-board upper bonding wire BW2_A1.

Figure 11A:
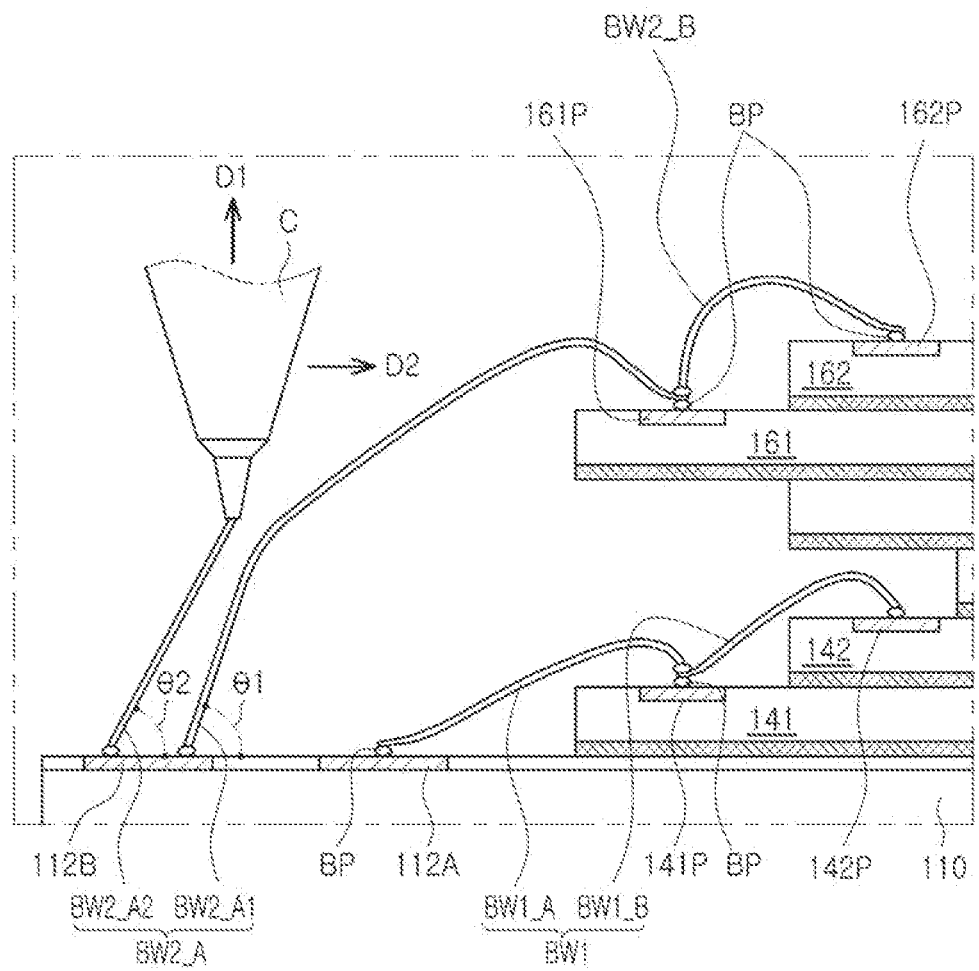
Figure 11B:
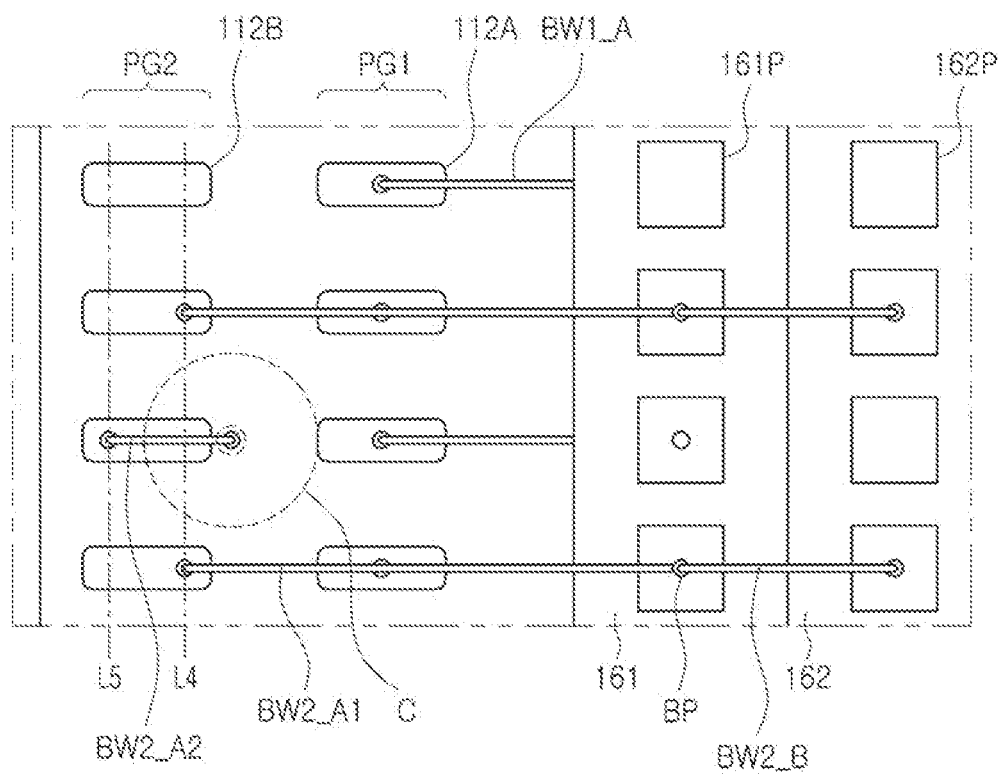

Next, referring to FIGS. 11A and 11B, while moving the capillary C in the upper direction D1, and at the same time moving the first semiconductor chips 141 and 142 in the arrangement direction D2, the second chip-substrate upper bonding wire BW2_A2 may be bent at a second angle θ2 with the upper surface of the package substrate 110. According to an example embodiment, the second angle θ2 may be smaller than the first angle θ1.

Figure 12A:
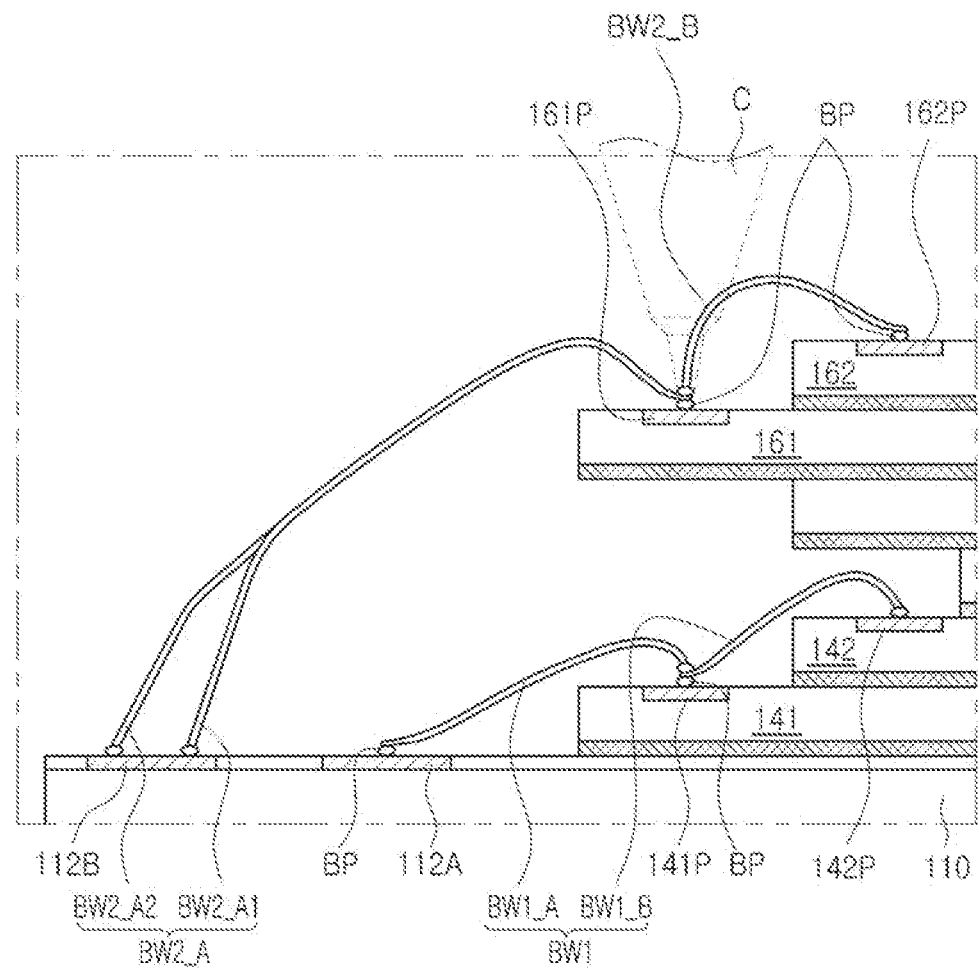
Figure 12B:
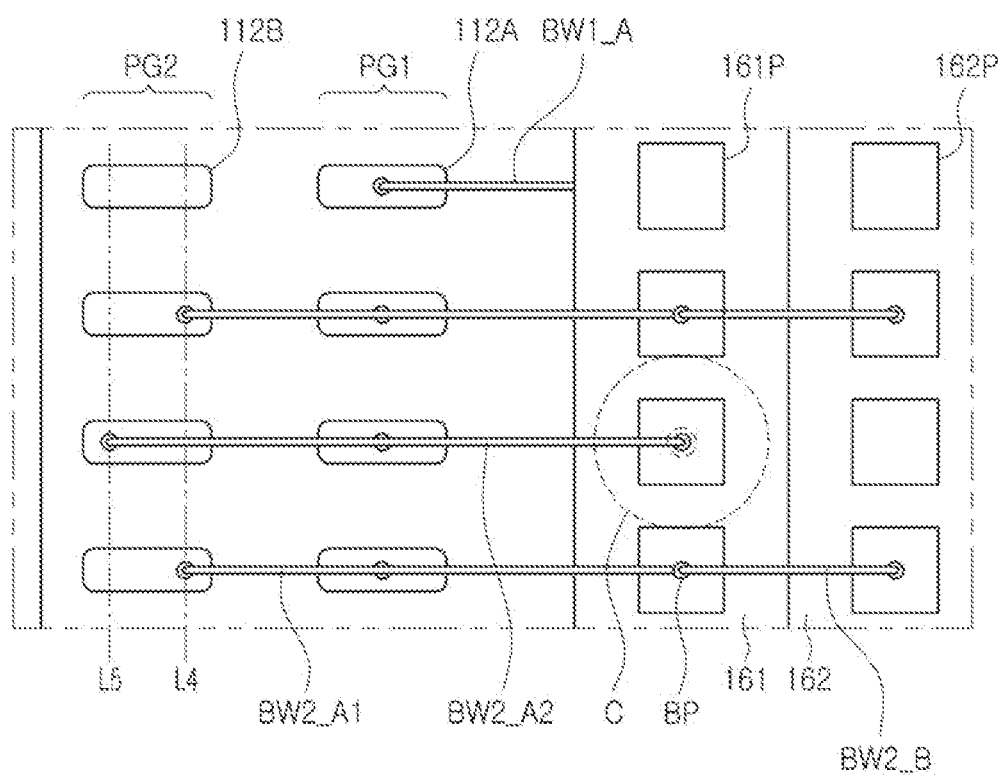

Next, referring to FIGS. 12A and 12B, the other end of the second chip-to-substrate upper bonding wire BW2_A2 may be stitch-bonded on the chip pad 161P of the lowermost second semiconductor chip 161. According to an example embodiment, the other end of the second chip-board upper bonding wire BW2_A2 may be stitch-bonded to the stud bump BP formed on the chip pad 161P.

Figure 13A:
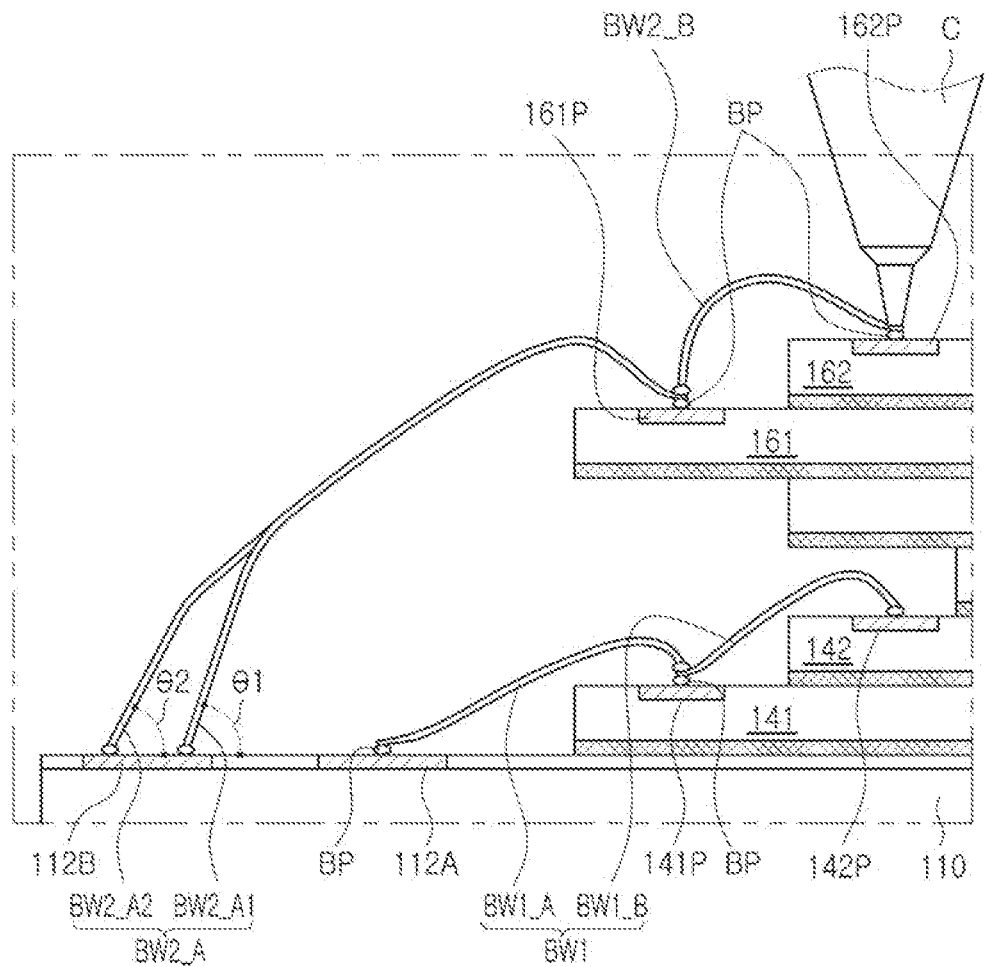
Figure 13B:
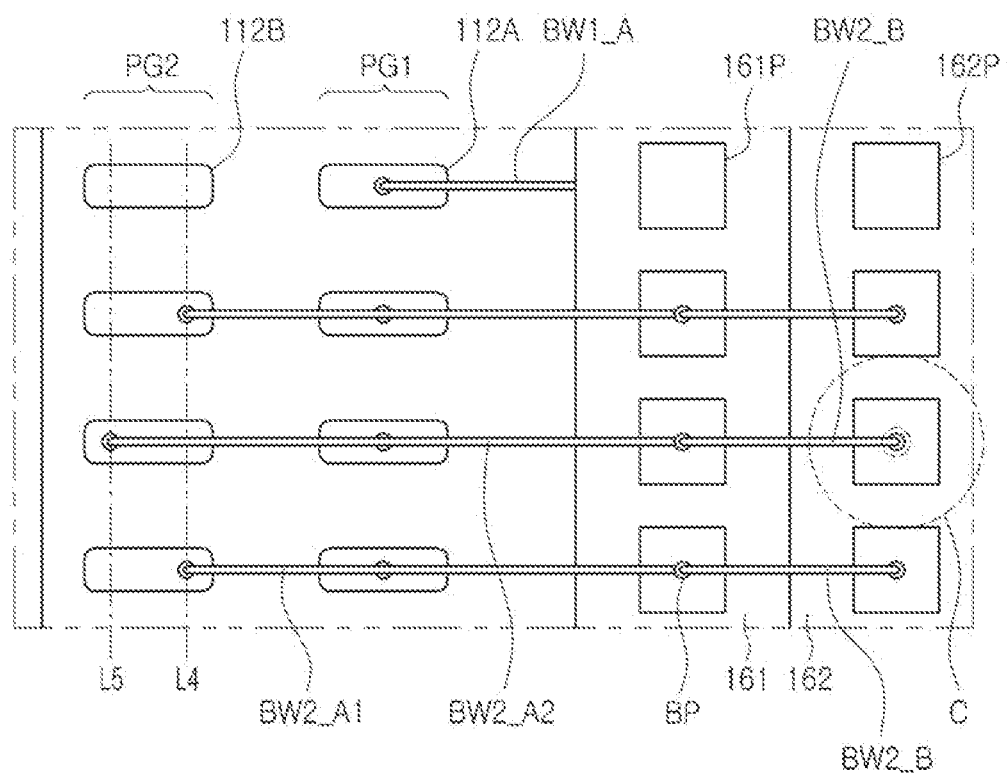

Next, referring to FIGS. 13A and 13B, one end of the inter-chip upper bonding wire BW2_B is bonded to the second chip pad 161P of the lowermost second semiconductor chip 161 by ball bonding, and the other end of the inter-chip upper bonding wire BW2_B may be connected to the second chip pad 162P of the second uppermost semiconductor chip 162 by stitch bonding. According to an example embodiment, one end of the inter-chip upper bonding wire BW2_B may be ball-bonded to the stud bump BP formed on the chip pad 161P. Also, according to an example embodiment, the other end of the inter-chip upper bonding wire BW2_B may be stitch-bonded to the stud bump BP formed on the chip pad 162P of the second uppermost semiconductor chip 162.

As set forth above, an example embodiment describes that by disposing the bonding wires in a zigzag shape and bending the loop shape of the bonding wires in the direction of the chip stack, a semiconductor package in which a contact between the capillary and the adjacent bonding wire may be prevented during the process of forming the bonding wires.

While aspects of example embodiments have been particularly shown and described, it will be understood that various changes in form and details may be made therein without departing from the spirit and scope of the following claims.

What is claimed is:

1. A semiconductor package comprising:
   a package substrate comprising first substrate pads arranged in a row in a first direction on a surface of the package substrate, and second substrate pads arranged in a row parallel to the row of the first substrate pads in the first direction on the surface of the package substrate;
   a first semiconductor chip disposed on the surface of the package substrate and comprising first chip pads disposed in the first direction, the first semiconductor chip being closer to the first substrate pads than to the second substrate pads;
   a second semiconductor chip comprising second chip pads disposed in the first direction, the second semiconductor chip overlapping an upper portion of the first semiconductor chip;
   lower bonding wires connecting the first chip pads to the first substrate pads; and
   upper bonding wires connecting the second chip pads to the second substrate pads,
   wherein the upper bonding wires comprise first upper bonding wires and second upper bonding wires alternately arranged in the first direction,
   wherein the first upper bonding wires contact the second substrate pads at an angle of 45° to 75° with respect to a direction of the first semiconductor chip,
   wherein a position at which the first upper bonding wires contact the second substrate pads is closer to the first semiconductor chip than a position at which the second upper bonding wires contact the second substrate pads is to the first semiconductor chip, and
   wherein the first upper bonding wires and the second upper bonding wires have a loop trajectory overlapping 70% or more.

2. The semiconductor package of claim 1, wherein an upper surface of the second semiconductor chip is spaced apart from the surface of the package substrate by at least 700 μm,
   wherein the lower bonding wires are ball-bonded to the first chip pads, and stitch-bonded to the first substrate pads, and
   wherein the upper bonding wires are stitch-bonded to the second chip pads, and ball-bonded to the second substrate pads.

3. The semiconductor package of claim 1, wherein the first upper bonding wires contact with the second substrate pads along a first straight line in the first direction and the second upper bonding wires are in contact with the second substrate pads along a second straight line in the first direction; and
   wherein the first straight line and the second straight line are spaced apart from each other by an interval of at least 100 μm.

4. The semiconductor package of claim 1, wherein the first upper bonding wires are respectively in contact with the surface of the package substrate at a first angle,
   wherein the second upper bonding wires are respectively in contact with the surface of the package substrate at a second angle, and
   wherein the first angle is greater than the second angle.

5. The semiconductor package of claim 1, wherein a length of each of the second upper bonding wires is longer than a length of each of the first upper bonding wires.

6. The semiconductor package of claim 1, wherein a pitch of the second chip pads is less than a pitch of the second substrate pads.

7. The semiconductor package of claim 1, wherein the first semiconductor chip and the second semiconductor chip have substantially the same size and overlap each other.

8. The semiconductor package of claim 1, wherein the first substrate pads, the second substrate pads and the second chip pads are provided with stud bumps disposed thereon, and
   the lower bonding wires and the upper bonding wires are stitch-bonded to the stud bumps.

9. The semiconductor package of claim 1, wherein the first chip pads are disposed adjacent to an edge of the first semiconductor chip and the second chip pads are disposed adjacent to an edge of the second semiconductor chip.

10. A semiconductor package comprising:
    a package substrate comprising first substrate pads arranged in a row in a first direction on a surface of the package substrate, and second substrate pads arranged in a row parallel to the row of the first substrate pads in the first direction on the surface of the package substrate;

a first semiconductor stack disposed on the surface of the package substrate and comprising at least two first semiconductor chips stacked offset from each other, each of the at least two first semiconductor chips comprising first chip pads disposed adjacent to a side edge of the respective first semiconductor chip;

a second semiconductor stack disposed on the first semiconductor stack and comprising at least two second semiconductor chips stacked offset from each other, each of the at least two second semiconductor chips comprising second chip pads disposed adjacent to a side edge of the respective second semiconductor chip;

lower bonding wires connecting the package substrate to a lowermost first semiconductor chip of the first semiconductor stack; and upper bonding wires connecting the package substrate to a lowermost second semiconductor chip of the second semiconductor stack, wherein the upper bonding wires comprise first upper bonding wires and second upper bonding wires alternately disposed in the first direction, and the first upper bonding wires contact the second substrate pads, and wherein a position at which the first upper bonding wires contact the second substrate pads is closer to the first semiconductor chip than a position at which the second upper bonding wires contact the second substrate pads is to the first semiconductor chip.

11. The semiconductor package of claim 10, wherein the first upper bonding wires contact the surface of the package substrate at an angle of 45° to 75° relative to a direction of the first semiconductor stack, wherein the lower bonding wires are ball-bonded to the first chip pads, and stitch-bonded to the first substrate pads, and wherein the upper bonding wires are stitch-bonded to the second chip pads, and ball-bonded to the second substrate pads.

12. The semiconductor package of claim 10, wherein the first upper bonding wires and the second upper bonding wires have a loop trajectory overlapping 70% or more.

13. The semiconductor package of claim 10, wherein an upper surface of a second semiconductor chip disposed at a lowermost portion of the second semiconductor stack is spaced apart from the surface of the package substrate by at least 700 μm.

14. The semiconductor package of claim 10, wherein the first upper bonding wires contact the second substrate pads along a first straight line in the first direction and the second upper bonding wires contact the second substrate pads along a second straight line in the first direction, and wherein the first straight line and the second straight line are spaced apart from each other at an interval of at least 100 μm.

15. The semiconductor package of claim 10, wherein the at least two first semiconductor chips and the at least two second semiconductor chips are stacked in a cascade structure.

16. The semiconductor package of claim 10, wherein a length of each of the second upper bonding wires is longer than a length of each of the first upper bonding wires.

17. The semiconductor package of claim 10, further comprising an encapsulant disposed on the package substrate and covering the first semiconductor stack and the second semiconductor stack.

18. A semiconductor package comprising:

a package substrate comprising substrate pads disposed in rows parallel to each other in a first direction on a surface of the package substrate;

a semiconductor chip comprising chip pads disposed in the first direction on the surface of the package substrate and spaced apart from the substrate pads; and bonding wires connecting the chip pads and the substrate pads, wherein the bonding wires comprise first bonding wires and second bonding wires alternately connected to the substrate pads in the first direction, wherein the first bonding wires are connected to the substrate pads at a first angle less than a right angle with respect to a direction of the semiconductor chip, wherein a position at which the first bonding wires contact the substrate pads is closer to the semiconductor chip than a position at which the second bonding wires contact the substrate pads is to the semiconductor chip, and wherein the second bonding wires are connected to the substrate pads at a second angle less than the first angle with respect to the direction of the semiconductor chip.

19. The semiconductor package of claim 18, wherein the first angle is an angle of 45° to 75°.

20. The semiconductor package of claim 18, wherein the first bonding wires and the second bonding wires have loop trajectories overlapping each other in a region higher than at least a first level with respect to the surface of the package substrate, and wherein the first level is 750 μm.

* * * * *